(12) United States Patent
Yu et al.

(10) Patent No.: US 8,148,826 B2
(45) Date of Patent: Apr. 3, 2012

(54) THREE-DIMENSIONAL INTEGRATED CIRCUITS WITH PROTECTION LAYERS

(75) Inventors: Chen-Hua Yu, Hsin-Chu (TW);
Wen-Chih Chiou, Miaoli (TW);
Weng-Jin Wu, Hsin-Chu (TW);
Hung-Jung Tu, Hualien (TW); Ku-Feng Yang, Dali (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/273,845

(22) Filed: Oct. 14, 2011

(65) Prior Publication Data
US 2012/0032348 A1 Feb. 9, 2012

Related U.S. Application Data

(60) Continuation of application No. 12/878,112, filed on Sep. 9, 2010, now Pat. No. 8,053,277, which is a division of application No. 11/641,324, filed on Dec. 19, 2006, now Pat. No. 7,812,459.

(51) Int. Cl.
*H01L 23/48* (2006.01)
*H01L 23/31* (2006.01)
*H01L 25/00* (2006.01)
*H01L 21/58* (2006.01)
*H01L 21/56* (2006.01)

(52) U.S. Cl. ......... 257/778; 257/E23.133; 257/E25.011; 257/E25.013; 257/E21.511; 148/DIG. 164; 438/108; 438/109

(58) Field of Classification Search .......... 257/777, 257/778, 686, E23.01, E23.023, E23.133, 257/E21.511; 438/108, 109, 456
See application file for complete search history.

(56) References Cited

U.S. PATENT DOCUMENTS

| | | |
|---|---|---|
| 5,394,303 A | 2/1995 | Yamaji |
| 6,133,637 A | 10/2000 | Hikita et al. |
| 6,268,660 B1 | 7/2001 | Dhong et al. |
| 6,501,663 B1 | 12/2002 | Pan |
| 6,747,348 B2 | 6/2004 | Jeung et al. |
| 6,750,539 B2 | 6/2004 | Haba et al. |
| 6,756,252 B2 | 6/2004 | Nakanishi |
| 6,846,725 B2 | 1/2005 | Nagarajan et al. |
| 6,908,856 B2 | 6/2005 | Beyne et al. |
| 7,595,222 B2 | 9/2009 | Shimoishizaka et al. |
| 2004/0000725 A1 | 1/2004 | Lee |
| 2004/0235266 A1 | 11/2004 | Tong |
| 2005/0146005 A1 | 7/2005 | Shimoishizaka et al. |
| 2005/0161795 A1 | 7/2005 | Tong et al. |
| 2008/0111230 A1 | 5/2008 | Kim et al. |
| 2008/0142990 A1 | 6/2008 | Yu et al. |
| 2008/0224322 A1 | 9/2008 | Shinogi |

OTHER PUBLICATIONS

Fukushima, T., et al., "New Three-Dimensional Integration Technology Using Self-Assembly Technique," 2005, IEEE, 4 pgs.

*Primary Examiner* — Mary Wilczewski
(74) *Attorney, Agent, or Firm* — Slater & Matsil, L.L.P.

(57) ABSTRACT

A semiconductor structure includes a first die comprising a first substrate and a first bonding pad over the first substrate, a second die having a first surface and a second surface opposite the first surface, wherein the second die is stacked on the first die and a protection layer having a vertical portion on a sidewall of the second die, and a horizontal portion extending over the first die.

20 Claims, 17 Drawing Sheets

THREE-DIMENSIONAL INTEGRATED CIRCUITS WITH PROTECTION LAYERS

This application is a continuation of U.S. patent application Ser. No. 12/878,112, filed Sep. 9, 2010, and entitled "Three-Dimensional Integrated Circuits with Protection Layers," which application is a divisional of U.S. patent application Ser. No. 11/641,324, filed Dec. 19, 2006, and entitled "Three-Dimensional Integrated Circuits with Protection Layers," which applications are hereby incorporated herein by reference.

TECHNICAL FIELD

This invention relates generally to integrated circuits, and more particularly to structures and formation methods of three-dimensional integrated circuits.

BACKGROUND

Since the invention of the integrated circuit, the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required.

An additional limit comes from the significant increase in the number and length of interconnections between devices as the number of devices increases. When the number and length of interconnections increase, both circuit RC delay and power consumption increase.

Three-dimensional (3D) integrated circuits (ICs) are therefore created to resolve the above-discussed limitations. In a typical formation process of 3D IC, two wafers, each including an integrated circuit, are formed. The wafers are then bonded with the devices aligned. Deep vias are then formed to interconnect devices on the first and second substrates.

Much higher device density has been achieved using 3D IC technology, and up to six layers of wafers have been bonded. As a result, the total wire length is significantly reduced. The number of vias is also reduced. Accordingly, 3D IC technology has the potential of being the mainstream technology of the next generation.

Conventional methods for forming 3D IC also include die-to-wafer bonding, wherein one or more die is bonded to a wafer. An advantageous feature of the die-to-wafer bonding is that the size of dies may be smaller than the size of chips on the wafer. During a typical die-to-wafer bonding process, spaces will be left between the dies. The spaces are typically filled with a coating, such as spin-on-glass. The wafer and the dies on wafer are then sawed. However, the conventional die-to-wafer bonding processes have drawbacks. The coating process introduces moisture and chemical contamination, which degrades the bonds between the dies and the wafer. A new die-to-wafer bonding process is therefore needed to solve this problem.

SUMMARY OF THE INVENTION

In accordance with one aspect of the present invention, a semiconductor structure includes a first die comprising a first substrate and a first bonding pad over the first substrate; a second die having a first surface and a second surface opposite the first surface, wherein the second die is stacked on the first die and a protection layer having a vertical portion on a sidewall of the second die; and a horizontal portion extending over the first die.

In accordance with another aspect of the present invention, a semiconductor structure includes a wafer comprising a first die and a second die, wherein each of the first and second dies includes a first substrate and a first bonding pad on a top surface of the first substrate. The semiconductor structure further includes a third die and a fourth die each having a first surface and a second surface opposite the first surface, wherein the third die is stacked on the first die, and the fourth die is stacked on the second die. Each of the third and the fourth dies includes a second substrate; an active device in the second substrate; an interconnect structure over the second substrate; a second bonding pad on the first surface and connected to the interconnect structure, wherein the second bonding pad of the third die is bonded to the first bonding pad of the first die, and wherein the second bonding pad of the fourth die is bonded to the first bonding pad of the second die; and a contact pad on the second surface and electrically connected to the second bonding pad. The semiconductor further includes a protection layer in a space between the third and the fourth dies, wherein the protection layer has vertical portions on sidewalls of the third die and the fourth die and a horizontal portion extending from over the first die to over the second die, and a coating on the protection layer, wherein the coating fills a remaining space between the third and the fourth dies.

In accordance with yet another aspect of the present invention, a semiconductor structure includes a supporter free from active devices, wherein the supporter comprises a first substrate and a first bonding pad over the first substrate. The semiconductor structure further includes a die having a first surface and a second surface opposite the first surface, wherein the die is stacked on the supporter, and a protection layer having a vertical portion on a sidewall of the second die and a horizontal portion extending over the supporter. The die includes a second substrate; an active device in the second substrate; an interconnect structure over the second substrate; a second bonding pad on the first surface and connected to the interconnect structure, wherein the second bonding pad is bonded to the first bonding pad of the supporter; and a contact pad on the second surface and electrically connected to the second bonding pad.

In accordance with yet another aspect of the present invention, a method for forming a semiconductor structure includes providing a wafer comprising a first die and a second die, each comprising a first substrate; and a first bonding pad on a top surface of the wafer, forming a third die and a fourth die, each having a first surface and a second surface opposite the first surface wherein the third die is stacked on the first die and the fourth die is stacked on the second die; forming a protection layer in a space between the third and the fourth dies, wherein the protection layer has vertical portions on sidewalls of the first and the second dies and a horizontal portion extending from over the first die to over the second die; and forming a coating on the protection layer; and filling a remaining space of the space between the third and the fourth dies.

In accordance with yet another aspect of the present invention, a method for forming a semiconductor structure includes providing a wafer comprising a first die and a second die, each comprising a first substrate; a first bonding pad on a top surface of the first substrate; and forming a third die and a fourth die each having a first surface and a second surface opposite the first surface. The steps of forming each of the third and the fourth dies comprise providing a second substrate; forming an active device in the second substrate; forming a deep dielectric plug in the second substrate; forming an interconnect structure physically connected to the deep dielectric plug; and forming a second bonding pad on the first surface, wherein the second bonding pad is connected to the interconnect structure. The method further includes stacking the first die to the third die with the first bonding pad of the first die bonded to the second bonding pad of the third die; stacking the second die to the fourth die with the first bonding pad of the second die bonded to the second bonding pad of the fourth die; forming a protection layer on the third and the fourth dies and in a space between the third and the fourth dies, wherein the protection layer has vertical portions on sidewalls of the third and the fourth dies and a horizontal portion extending from over the first die to over the second die; forming a coating on the protection layer; filling a remaining space of the space between the third and the fourth dies; polishing the coating, the protection layer, and the first substrate of the third and the fourth dies to expose the deep dielectric plug; replacing the deep dielectric plugs of the third and the fourth dies with a conductive material to form through-silicon vias; and forming contact pads electrically interconnected to the through-silicon vias of the third and fourth dies.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1 through 11 are cross-sectional views of intermediate stages in the manufacturing of an embodiment of the present invention, wherein dies are bonded on a wafer;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of a novel method for forming a three-dimensional integrated circuit (3DIC) are illustrated in FIGS. 1 through 11. The variations of the preferred embodiments are then discussed. Throughout the various views and illustrative embodiments of the present invention, like reference numbers are used to designate like elements.

Figure 1:
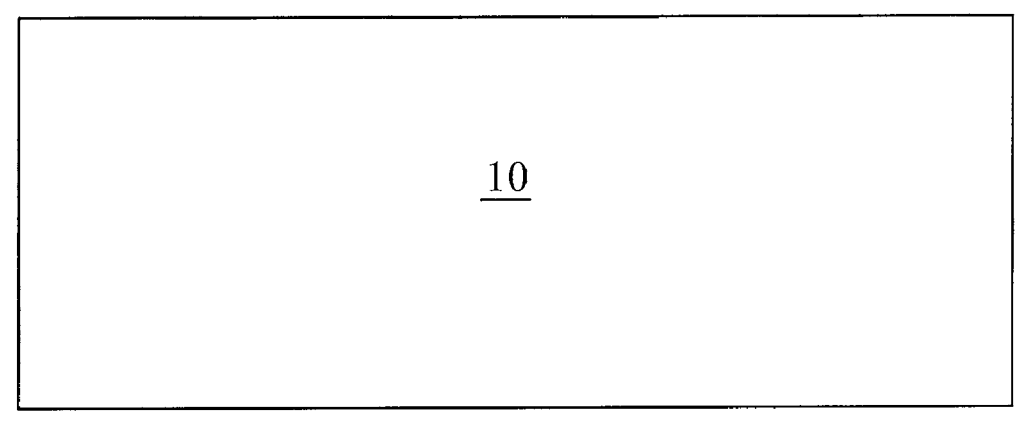

FIGS. 1 through 5 illustrate the preparation of a die, which will be stacked on a wafer. Referring to FIG. 1, a semiconductor substrate 10 is provided. Shallow trench isolation (STI) regions 12 and openings 16 are then formed in semiconductor substrate 10, as illustrated in FIG. 2A. As is known in the art, STI regions 12 may be formed by forming openings in semiconductor substrate 10 and filling the openings with a dielectric material such as high-density plasma (HDP) oxide. Preferably, the formation of openings 16 includes forming and patterning mask layer 14, which may be a photo resist, on substrate 10, and etching semiconductor substrate 10. The etching may be a dry etching with the assist of plasma. Alternatively, openings 16 may be formed by laser drilling. Openings 16 preferably have a depth greater than about 5 μm, and more preferably between about 5 μm and about 50 μm. Mask layer 14 is then removed.

Figure 2A:
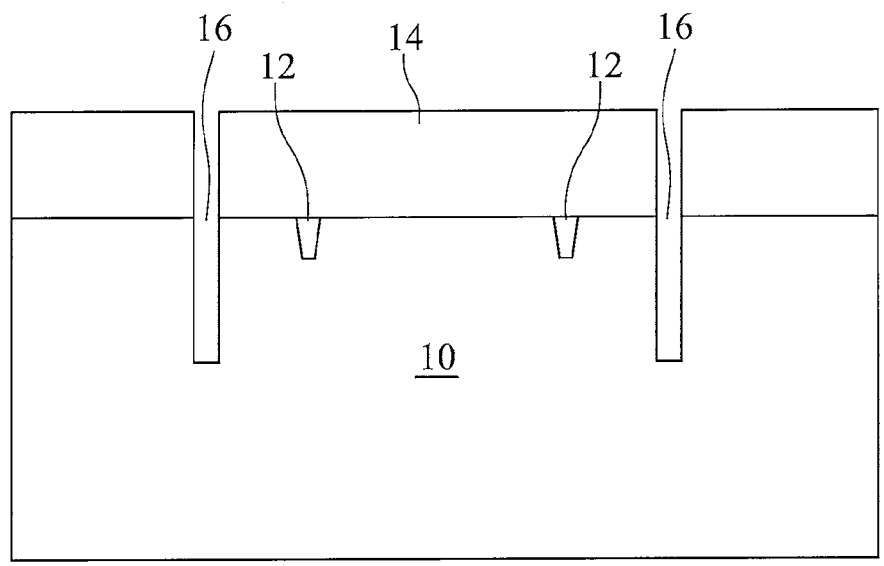
Figure 2B:
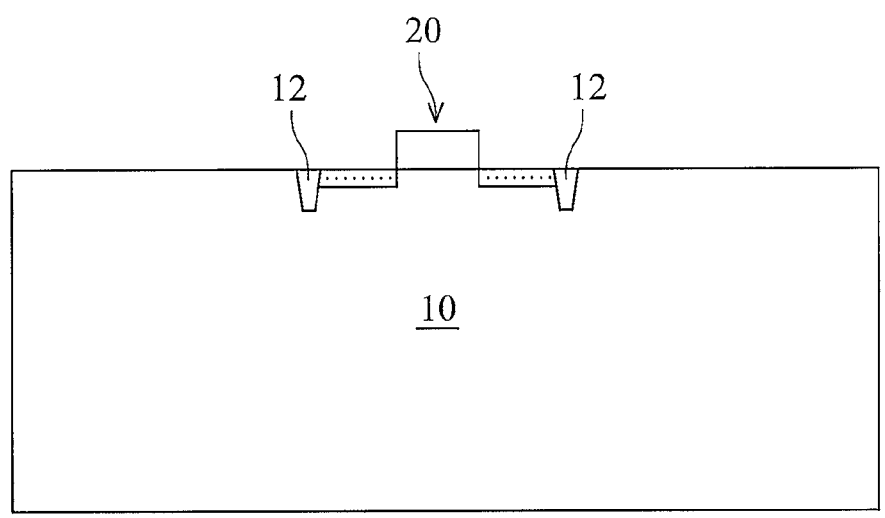
Figure 3A:
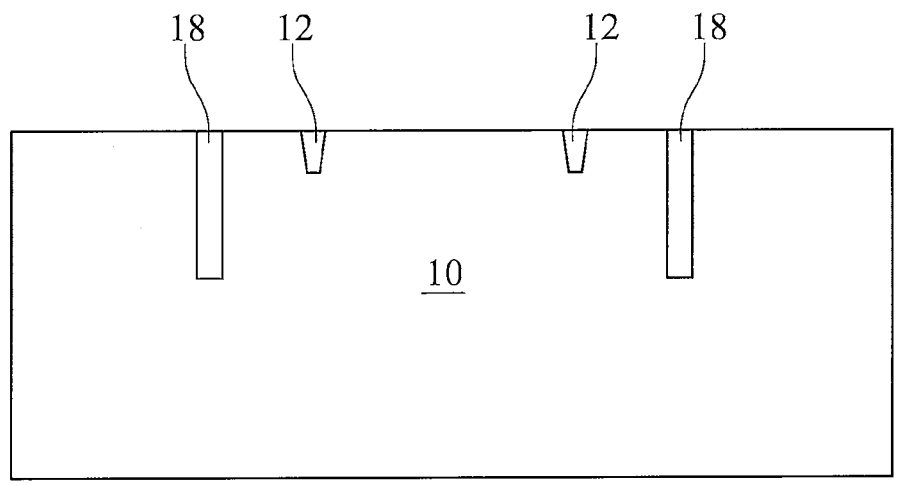
Figure 3B:
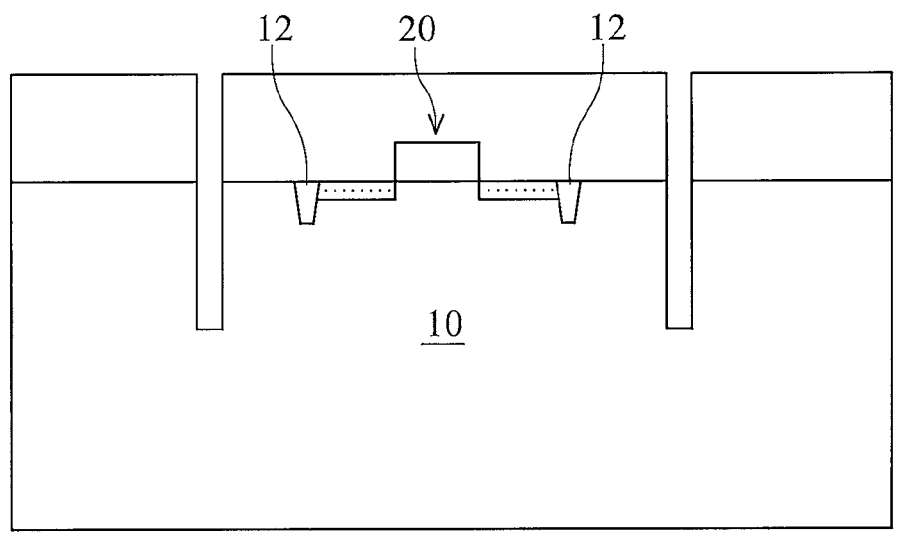
Figure 4:
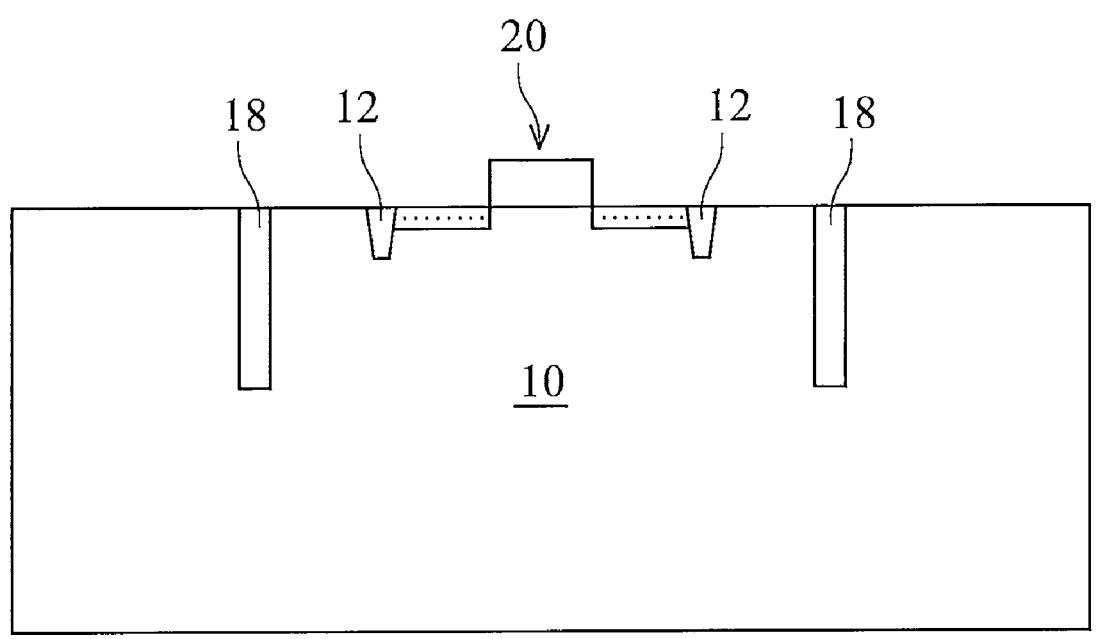

Referring to FIG. 3A, openings 16 are filled with a material having different etching characteristics from substrate 10, preferably a dielectric material, resulting in deep plugs 18. For simplicity, deep plugs 18 are alternatively referred to as deep dielectric plugs 18. FIG. 4 illustrates the formation of integrated circuits, which includes active devices, at a surface portion of semiconductor substrate 10, wherein a metal-oxide-semiconductor (MOS) device is used to symbolize integrated circuit 20. Alternatively, integrated circuit 20 may be formed before the formation of deep dielectric plugs 18, as is illustrated in FIGS. 2B and 3B.

Figure 5:
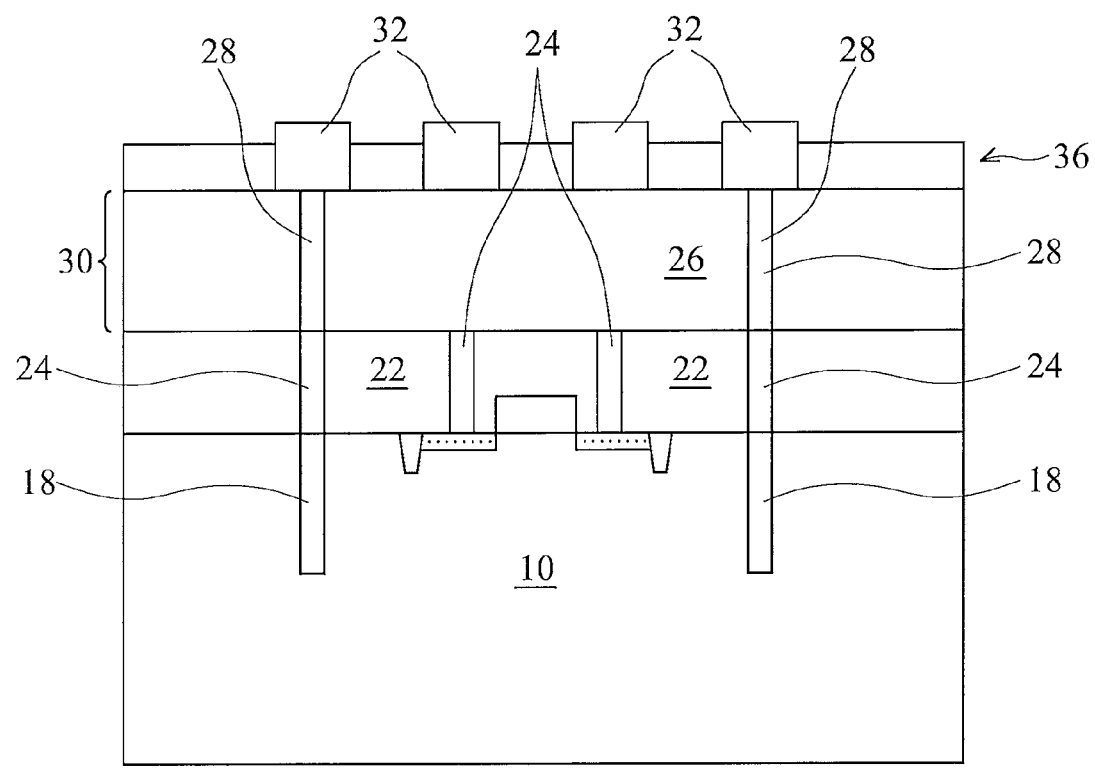

Referring to FIG. 5, an inter-layer dielectric (ILD) 22 is formed on the structure shown in FIG. 4, and contact plugs 24 are formed in ILD 22. Some of the contact plugs 24 physically contact deep dielectric plugs 18, while the others (not shown) may be electrically connected to devices in integrated circuit 20. Contact plugs 24 may be formed of metallic materials including tungsten, copper, aluminum, silver, and other commonly used materials. An interconnect structure 30 is then formed, which includes metallization layers formed in dielectric layers. Conductive features 28 are schematically illustrated to represent metal lines in metallization layers and the connecting vias, and a dielectric layer 26 is used to symbolize a plurality of inter-metal dielectric layers. The inter-metal dielectric layers may include low-k materials with k values less than about 3.5, such as carbon-doped silicon oxide. Interconnect structure 30 interconnects deep dielectric plugs 18 to bonding pads 32, which are located on the top of interconnect structure 30. Bonding pads 32 may include metals such as copper, tungsten and aluminum, alloys such as CuSn, AuSn, InAu, PbSn, and combinations thereof. Horizontal dimension of each of the bonding pads 32 is preferably less than about 50*50 μm$^2$. The formation processes for ILD 22, contact plugs 24, interconnect structure 30, and bonding pads 32 are well known in the art, thus are not repeated herein. The resulting structure is referred to as a die 36. One skilled in the art will realize that die 36 is preferably fabricated as a part of a wafer and sawed from the wafer after the interconnect structures and bonding pads are formed.

Figure 6:
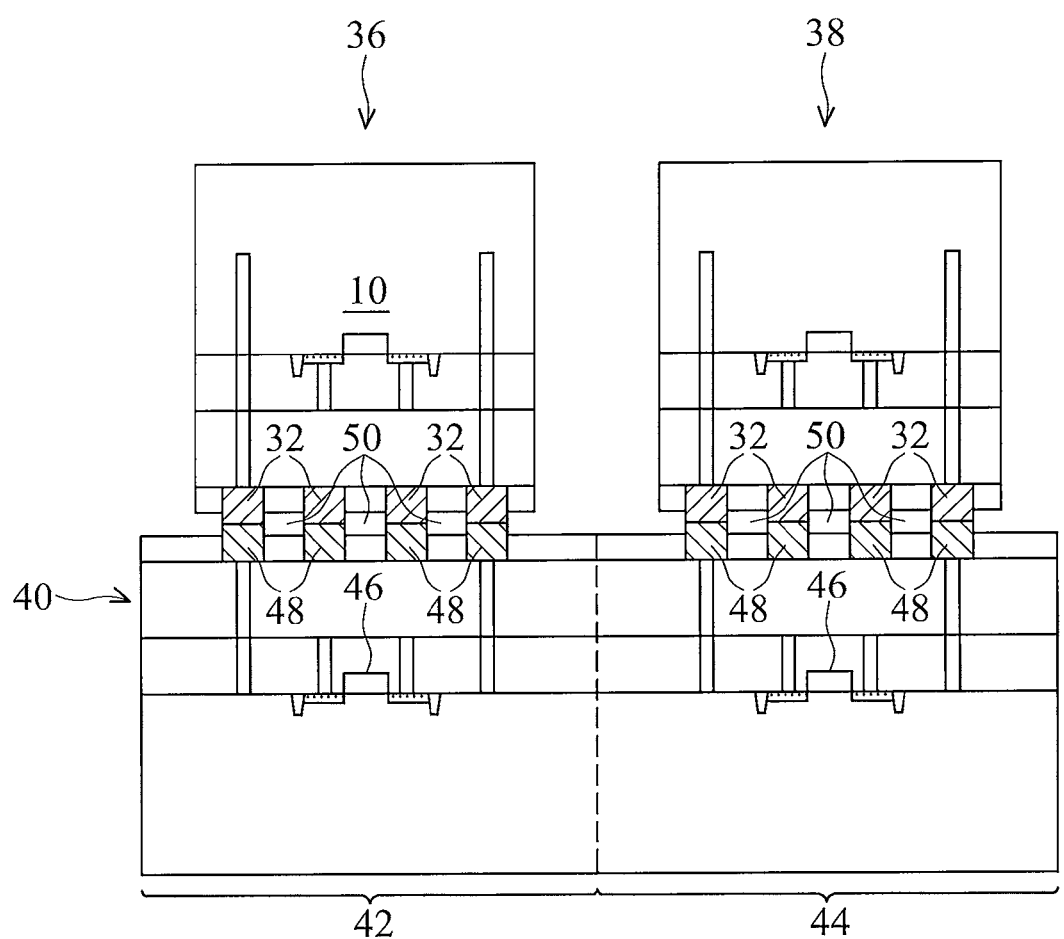

Referring to FIG. 6, die 36 is flipped upside-down and placed against a wafer 40. For simplicity, only two dies 42 and 44 in wafer 40 are illustrated, although a wafer will contain a plurality of identical dies. In FIG. 6, die 36 is placed against die 42, and another die 38, which has an identical structure as die 36, is placed against die 44. Preferably, each of the plurality of dies in wafer 40 is bonded to at least one die. Such a bonding is typically referred to as a die-to-wafer bonding. Similar to die 36, dies 42 and 44 may also include integrated circuits 46 formed therein, and bonding pads 48 on top of the dies. Bonding pads 48 on dies 42 and 44 are aligned with bonding pads 32 on dies 36 and 38, respectively, and may be bonded using direct copper bonding (also referred to copper-to-copper bonding, although bonding pads 32 and 48 may include other elements than copper.), fusion bonding, diffusion bonding or solder bump bonding. In an exemplary direct copper bonding process, dies 36 and 38 are bonded to wafer 40 by applying a high pressure, which may be about 10 pounds per square inch (psi) to about 100 psi. The temperature is preferably between about 300° C. and about 500° C.

There are typically gaps 50 between neighboring bonding pads 32 and 48. These gaps 50 may be filled with gap-filling materials such as underfills, which are commonly used in packaging art. Alternatively, gaps 50 may be left as they are, so that air insulations are formed between bonding pads.

Figure 7:
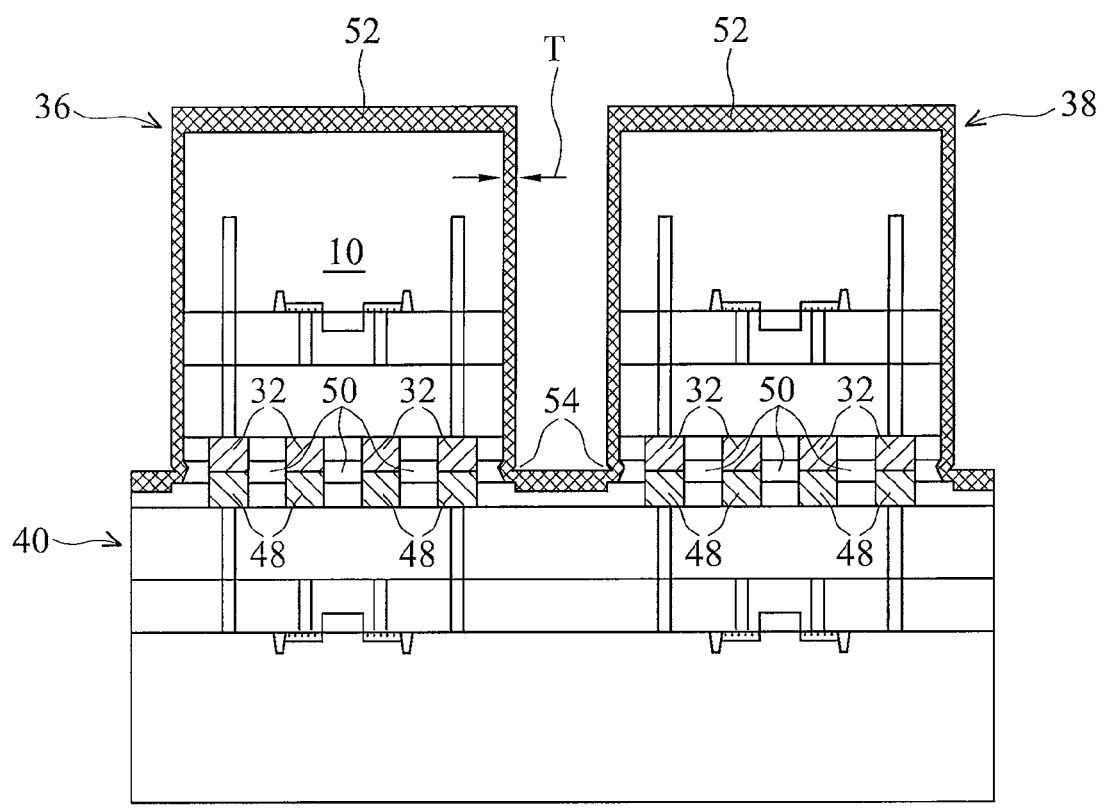

Referring to FIG. 7, a protection layer 52 is blanket formed, preferably conformably, on sidewalls of dies 36 and 38. It is noted that at corners 54, protection layer 50 is preferably continuous so that pads 32, 48 and the respective bonds are fully sealed from external environment. Protection layer 52 is preferably formed of dense dielectric layers that have good insulating ability, so that it will prevent moisture and chemicals in external environment from penetrating it and reaching bonds between pads 32 and 48. The preferred materials of protection layer 52 include diamond film, amorphous carbon, silicon oxide, silicon nitride, silicon carbide, silicon oxynitride, silicon oxycarbide, and combinations thereof. The thickness T of protection layer 52 is preferably between about 50 Å and about 2000 Å, although the optimum thickness depends on its density and conformity on sidewalls of dies 36 and 38. The preferred formation methods include physical vapor deposition, dipping, chemical vapor deposition (CVD) methods such as plasma enhanced CVD (PECVD), low pressure CVD (LPCVD), atomic layer CVD (ALCVD), and the like.

Figure 8:
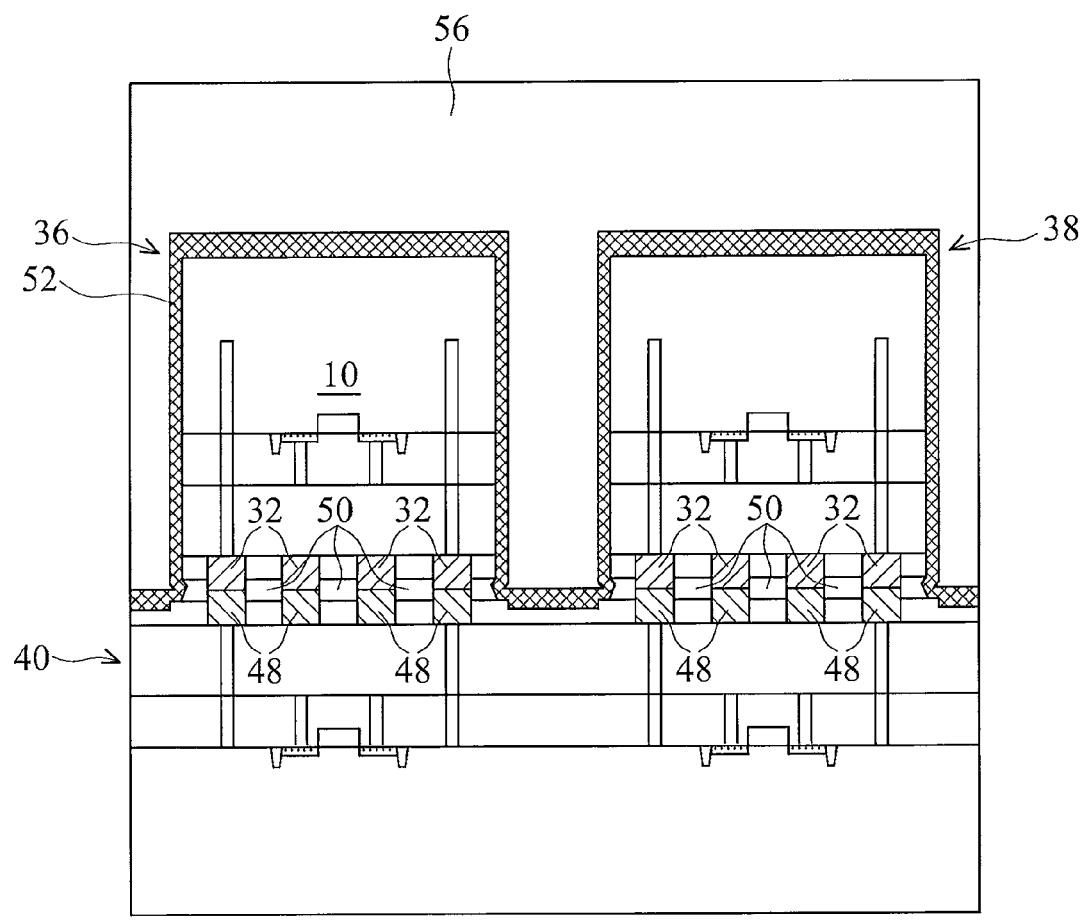

FIG. 8 illustrates the filling of a coating 56 into the remaining spacing between dies 36 and 38. The filling of a coating 56 into the remaining spacing between dies 36 and 38 can be performed by spin coating, stencil or dispensing. The preferred gap-filling materials include spin-on-glass, polyimide, bis-benzocyclobutene (BCB), and other commonly used gap-filling materials/polymers. The formation methods include spin coating, dipping, and the like. Preferably, coating 56 can endure a relatively high temperature, for example, about 400° C., which may occur in subsequent processes. The material density of coating 56 is preferably smaller than that of protection layer 52.

During the subsequent processes, coating 56 may release contaminations such as moisture and/or chemicals. These materials will corrode bonding pads 32 and 48 and degrade their bonds. In addition, coating 56 is typically not dense enough to prevent moisture and chemicals from penetrating through it from outside. Protection layer 52 thus protects moisture and/or chemicals from reaching bonding pads 32, 48 and their bonds. The reliability of the stacked dies is thus improved.

Figure 9:
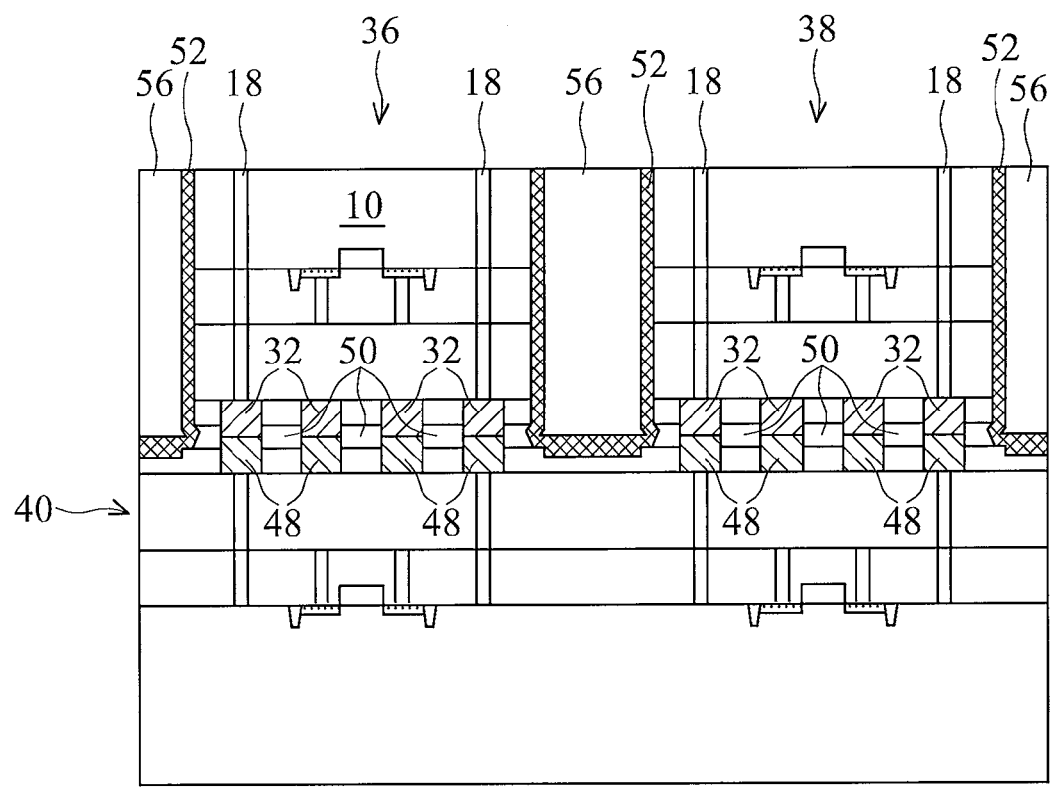

Referring to FIG. 9, a chemical mechanical polish (CMP) is preformed to remove portions of coating 56, protection layer 52 and substrate 10, until deep dielectric plugs 18 are exposed. Alternatively, grinding, plasma etching, or wet etching may be used for the exposure of deep dielectric plugs 18.

Figure 10:
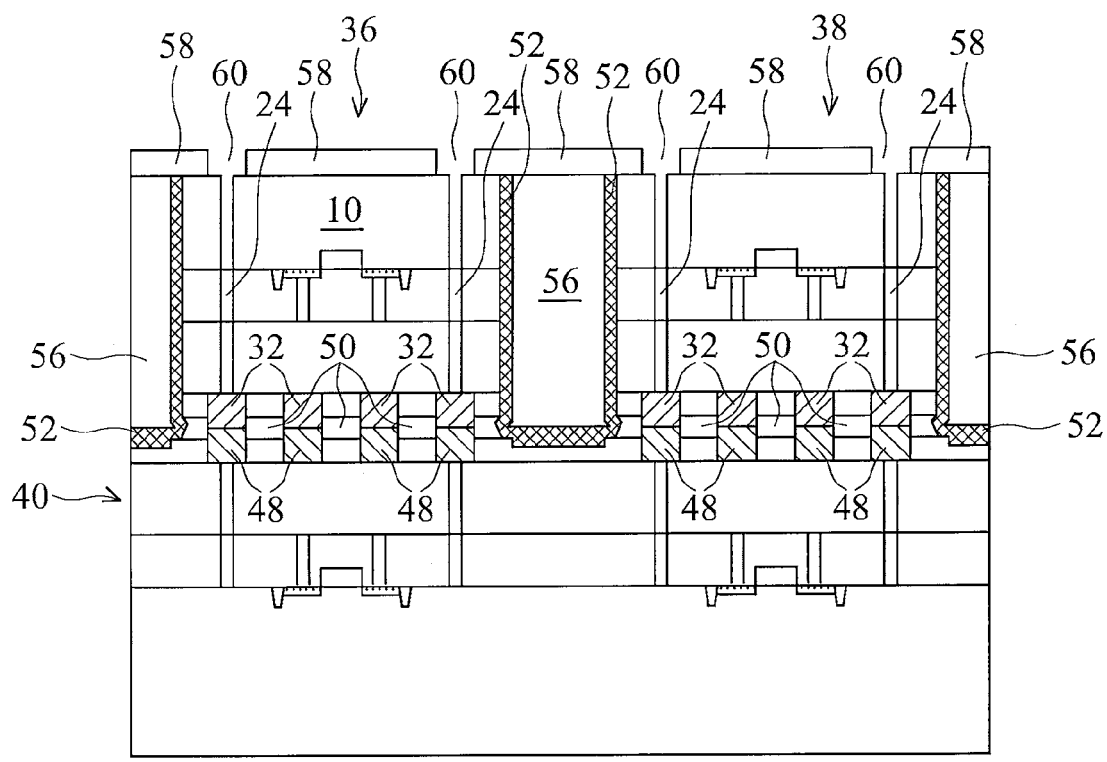

FIG. 10 illustrates the formation and patterning of a passivation layer 58. Passivation layer 58 preferably includes dielectric materials such as silicon oxide or silicon nitride formed using PECVD, although other materials can also be used. Openings 60 are then formed to expose deep dielectric plugs 18. Deep dielectric plugs 18 are then removed so that openings 60 extend downward to expose contact plugs 24. Preferably, the patterning of passivation layer 58 and the removal of deep dielectric plugs 18 comprise plasma etching. However, wet etching can also be performed.

Figure 11:
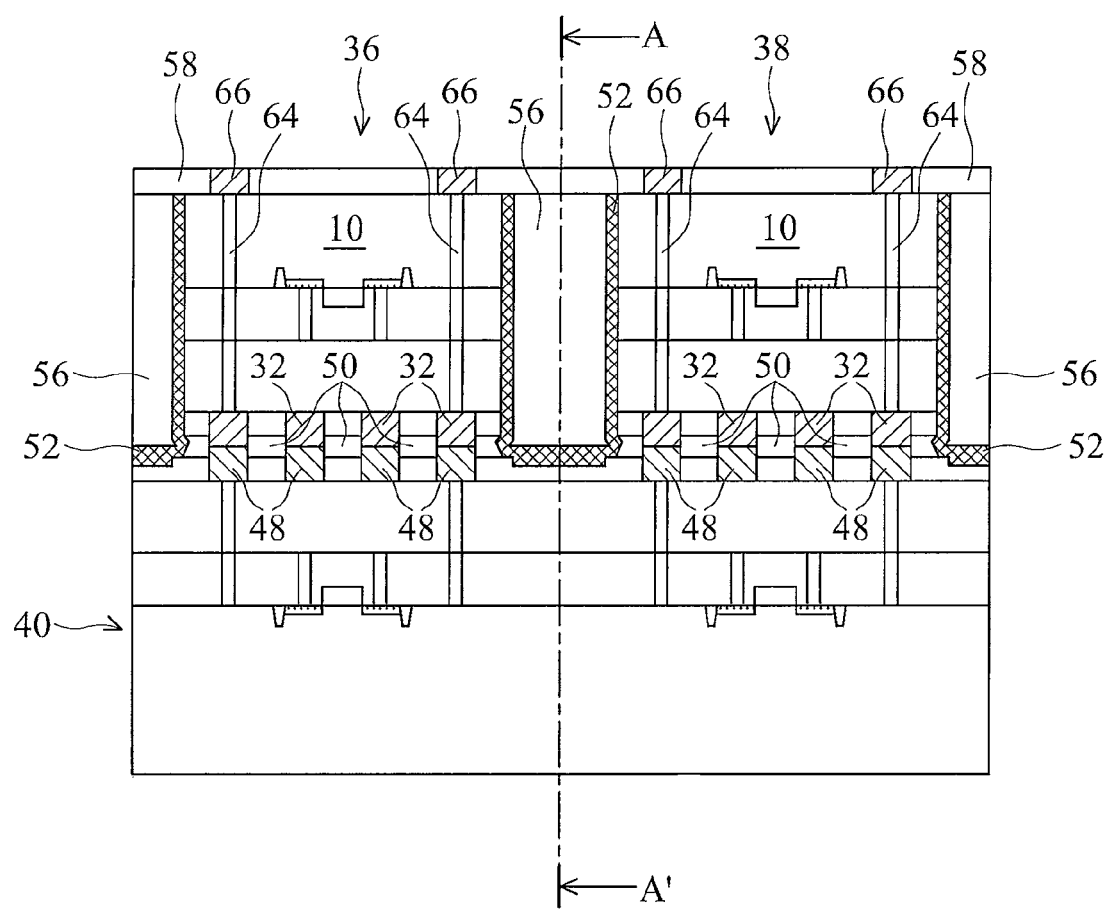

Referring to FIG. 11, openings 60 are filled with conductive materials. Preferably, diffusion barrier layers (not shown), which may include metal nitrides such as tantalum nitride (TaN) and titanium nitride (TiN), and metals such as Ta, Ti, CoW, are formed in openings 60. A conductive material, which may include copper, copper alloy, tungsten, aluminum, aluminum alloy, silver, and combinations thereof, is then filled into the remaining portions of openings 60, forming through-silicon vias 64 in substrate 10 and contact pads 66 in passivation layer 58. The conductive material can be formed using electrical plating or a CVD method.

Figure 12:
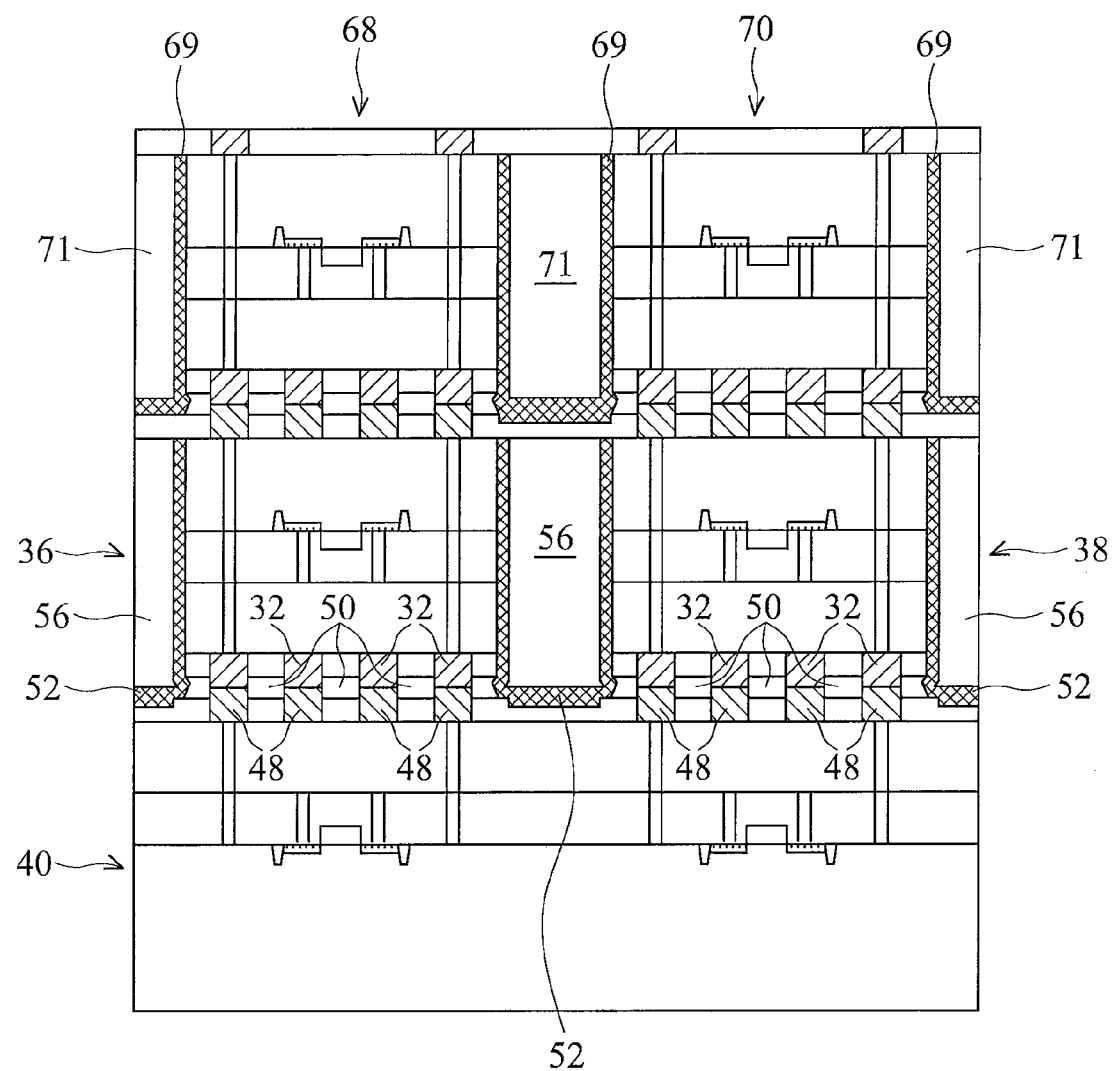
FIG. 12 illustrates an additional layer of dies stacked on a die-to-wafer bonding structure.

The wafer shown in FIG. 11 may then by sawed along a line A-A' to separate dies. The resulting dies are stacked dies. It is appreciated that if more than two layers of dies need to be stacked, additional dies may be processed using similar steps as shown in FIGS. 1 through 5, and then stacked on the wafer shown in FIG. 11. An exemplary embodiment is shown in FIG. 12, wherein dies 68 and 70 are further stacked. One skilled in the art will realize the respective formation steps. Sidewalls of dies 68 and 70 are preferably protected by an additional protection layer 69, which comprises essentially the same materials as protection layer 52. Also, a coating 71, which comprises essentially the same materials as coating 56, is formed.

Figure 13:
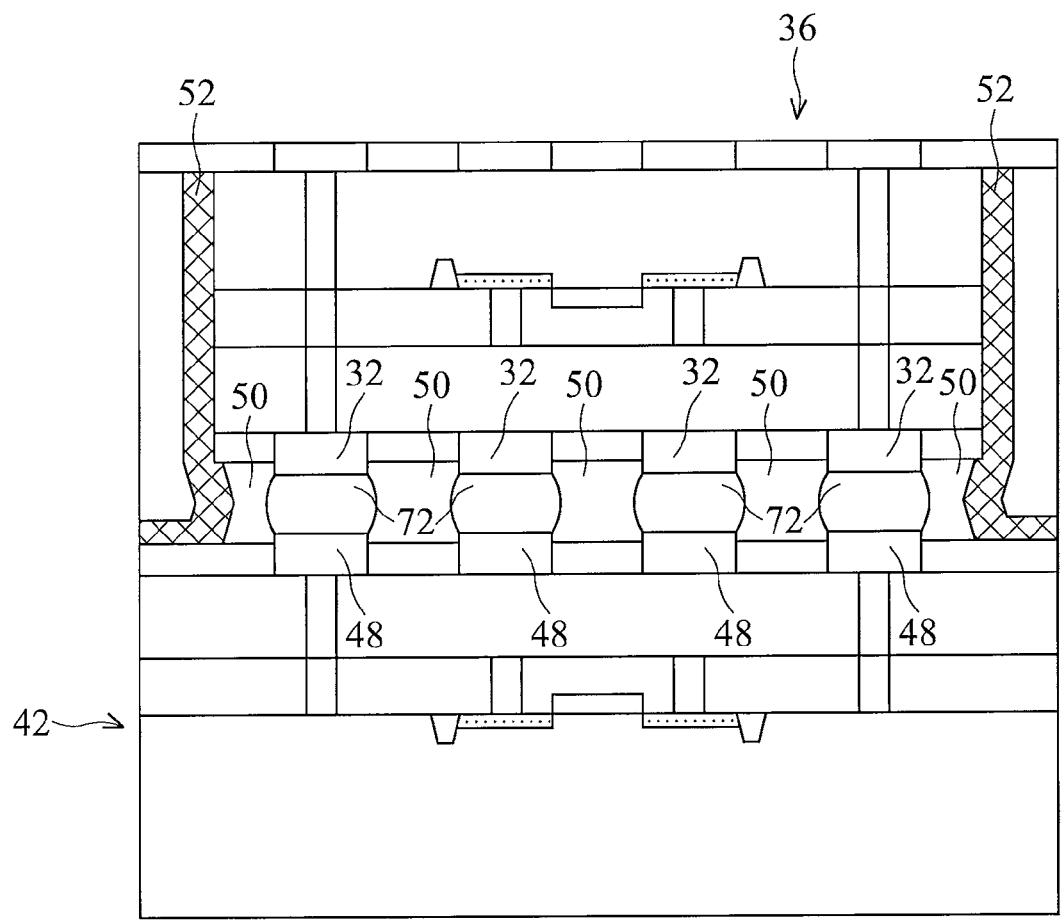
FIG. 13 illustrates an embodiment of stacked dies, wherein the bonding between bonding pads are solder bumps.

In the embodiments discussed in the preceding paragraphs, dies 36 and 38 are bonded to wafer 40 using copper-to-copper bonding. In alternative embodiments, solder bumps may be used. In FIG. 13, solder bumps 72 are used to electrically connect bonding pads 32 of die 36 and bonding pads 48 of die 42. Similar to the case illustrated in FIG. 6, gaps 50 may either be air insulations, or filled with gap-filling materials. In alternative embodiments, fusion bonding or diffusion bonding may be used to form stacked dies, wherein a protection layer as shown in FIG. 11 is desired regardless of the bonding methods.

Figure 14:
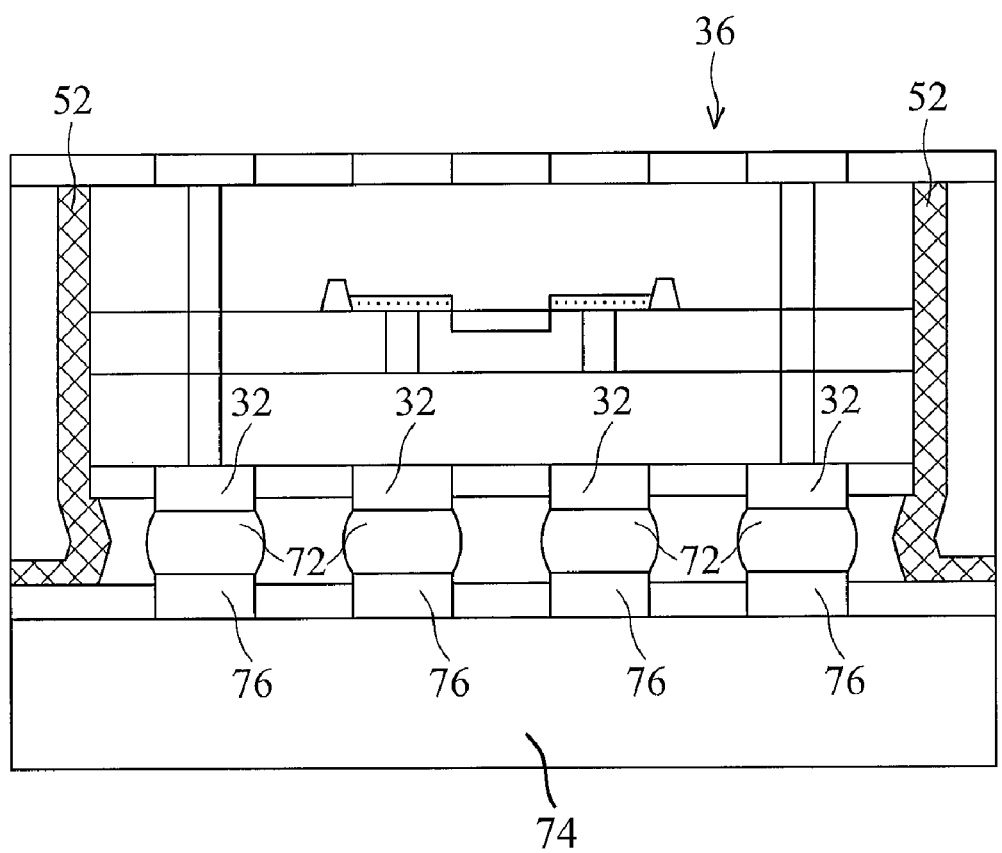
FIG. 14 illustrates the stacking of dies on a supporter wafer.

In a further embodiment of the present invention, as illustrated in FIG. 14, wafer 40 (refer to FIG. 6) may be replaced with a supporter wafer 74, which does not contain active devices therein. In this case, bonding pads 32 of die 36 are connected to bonding pads 76 on supporter wafer 74. It is to be noted that some of bonding pads 76 can also be electrically interconnected through metal lines, which are not in the same plane as the cross-sectional view, and thus are not shown. The bonding pads 76 are eventually connected back to interconnect structure or devices in die 36. Therefore, supporter wafer 74 not only provides a structural support, but also provides electrical routing ability. The substrate of the support wafer 74 may comprise a semiconductor material such as silicon, or a dielectric material such as glass. The support wafer 74 also provides the function of heat dissipation.

Figure 15A:
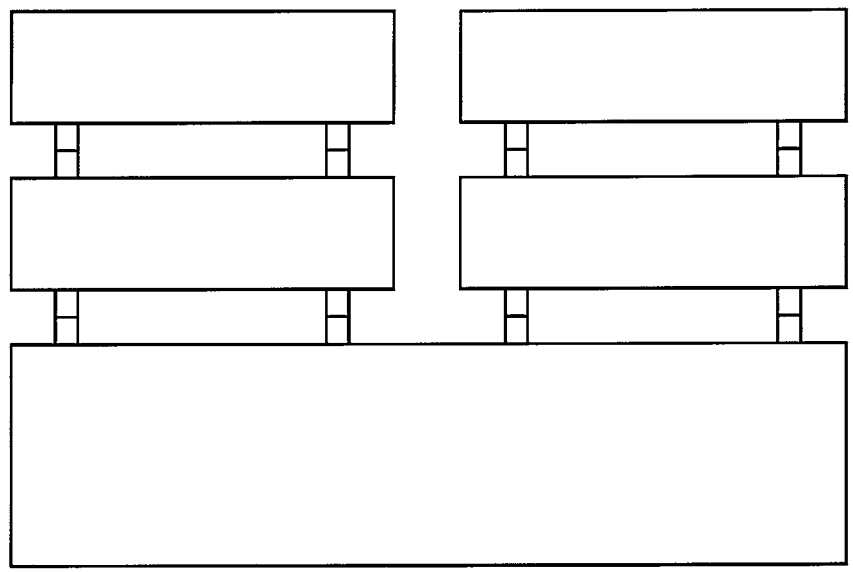
FIGS. 15A through 15E illustrate different stacking schemes, wherein dies having different sizes are stacked.
Figure 15B:
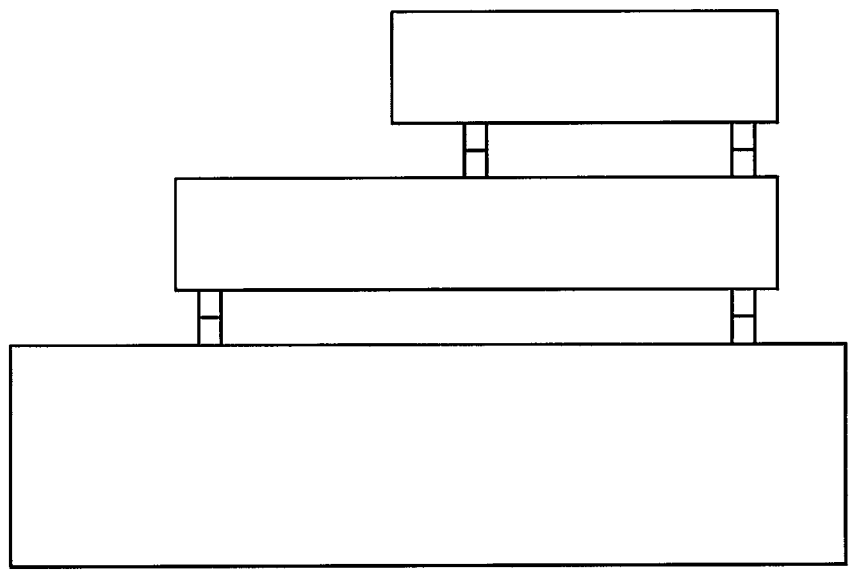
Figure 15C:
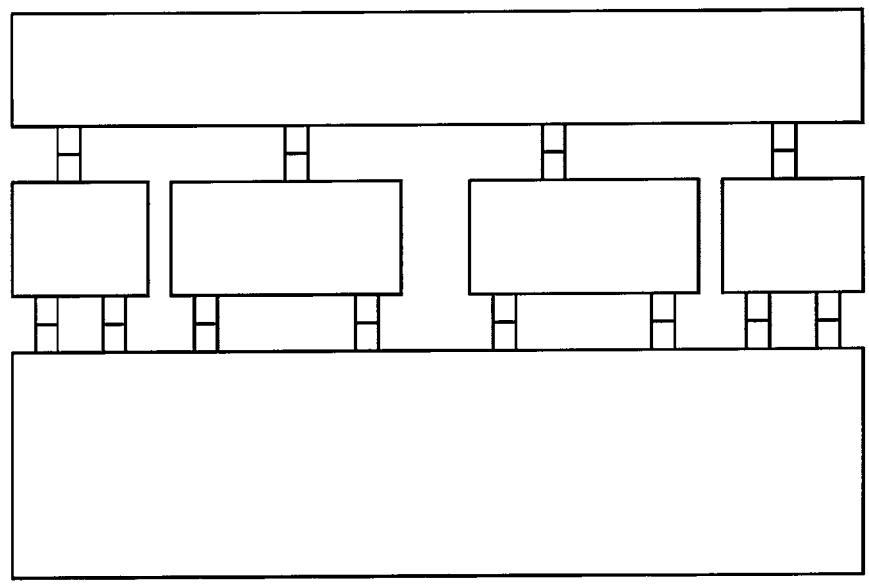
Figure 15D:
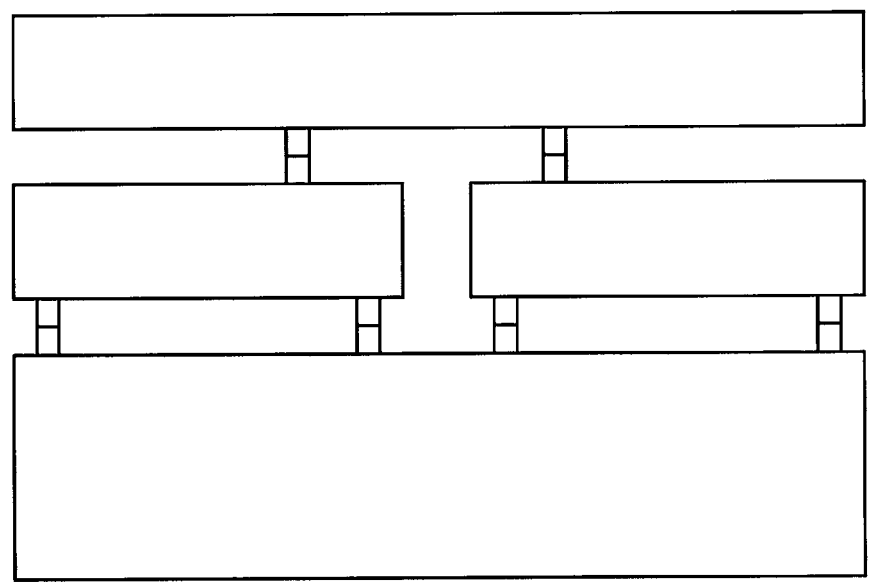
Figure 15E:
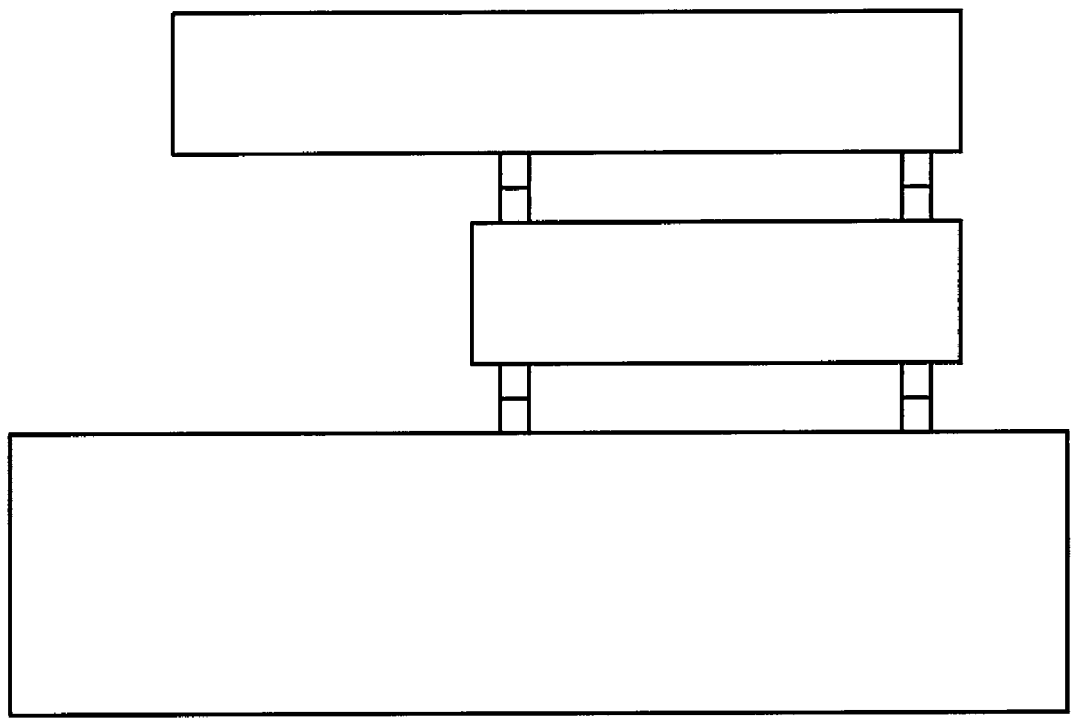

An advantageous feature of die-to-wafer bonding is that dies do not have to have the same size as dies on wafers. This provides significant flexibility. FIGS. 15A through 15E illustrate some exemplary schemes for utilizing this advantageous feature. In FIG. 15A, more than one die may be stacked side-by-side on other dies. In FIG. 15B, in each layer, the stacked dies may have increasingly smaller sizes. In FIGS. 15C and 15D, one or more die may be formed between two dies with greater sizes. FIG. 15E illustrates a third level die having a greater size than a second level die. One skilled in the art will realize that there are more available schemes. With more levels of dies stacked, the reliability of bonds between dies becomes a more significant factor to the overall reliability of stacked dies. The formation of protection layer serves the requirement for higher demands in reliability.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
a wafer;
a first die and a second die stacked over the wafer;
a protection layer in a space between the first die and the second die, wherein the protection layer comprises:
a bottom portion at a bottom of the space; and
vertical portions over and connected to opposite ends of the bottom portion, wherein the vertical portions are on sidewalls of the first die and the second die; and
a coating over the bottom portion of the protection layer and filling the space.

2. The semiconductor structure of claim 1, wherein the wafer comprises a third die bonded to the first die, and a fourth die bonded to the second die, and wherein each of the third die and the fourth die comprises:
a substrate; and
a bonding pad on a top surface of the substrate.

3. The semiconductor structure of claim 2, wherein each of the first die and the second die comprises:
a substrate;
an active device at a surface of the substrate; and
a first bonding pad electrically coupled to the active device, wherein the first bonding pad bonds the each of the first die and the second die to a die in the wafer.

4. The semiconductor structure of claim 3, wherein the first bonding pad of the first die is bonded to a first bonding pad of the third die, and wherein the first bonding pads of the first die and the third die form a space with neighboring bonding pads of the first die and the third die, and wherein the space is an air insulation.

5. The semiconductor structure of claim 3, wherein the first bonding pad of the first die is bonded to a first bonding pad of the third die, and wherein the first bonding pads of the first die and the third die form a space with neighboring bonding pads of the first die and the third die, and wherein the space comprises a gap-filling material.

6. The semiconductor structure of claim 1, wherein the first die and the wafer have a gap therebetween, and wherein the protection layer seals the gap.

7. The semiconductor structure of claim 1, wherein top edges of the vertical portions of the protection layer are substantially level with a top surface of the coating.

8. The semiconductor structure of claim 1, wherein the protection layer comprises a material selected from the group consisting essentially of diamond film, amorphous carbon, silicon oxide, silicon nitride, silicon carbide, silicon oxynitride, silicon oxycarbide, and combinations thereof.

9. The semiconductor structure of claim 1, wherein the protection layer encircles the first die and the second die.

10. A semiconductor structure comprising:
a wafer comprising a first die and a second die, each comprising:
a first substrate; and
a first bonding pad on a top surface of the first substrate;
a third die and a fourth die each having a first surface and a second surface opposite the first surface, wherein the third die is stacked on the first die, and the fourth die is stacked on the second die, and wherein the third die and the fourth die each comprise:
a second substrate;
an active device in the second substrate;
an interconnect structure over the second substrate;
a second bonding pad on the first surface and connected to the interconnect structure, wherein the second bonding pad of the third die is bonded to the first bonding pad of the first die, and wherein the second bonding pad of the fourth die is bonded to the first bonding pad of the second die; and
a contact pad on the second surface and electrically connected to the second bonding pad;
a protection layer in a space between the third die and the fourth die, wherein the protection layer has vertical portions on sidewalls of the third die and the fourth die, and a horizontal portion extending from over the first die to over the second die; and
a coating on the protection layer and filling a remaining space between the third and the fourth dies.

11. The semiconductor structure of claim 10, wherein the third die and the first die have a gap therebetween, and wherein the protection layer seals the gap.

12. The semiconductor structure of claim 10, wherein the protection layer is formed on all sidewalls of the third die and the fourth die, and forms a continuous layer with the horizontal portion of the protection layer.

13. The semiconductor structure of claim 10, wherein each of the first die and the second die comprises an active device.

14. The semiconductor structure of claim 10, wherein the first bonding pad of the first die and the second bonding pad of the third die form a space with neighboring bonding pads, and wherein the space is an air insulation.

15. The semiconductor structure of claim 10, wherein the first bonding pad of the first die and the second bonding pad of the third die form a space with neighboring bonding pads, and wherein the space comprises a gap-filling material.

16. A semiconductor structure comprising:
a supporter free from active devices, the supporter comprising:
a first substrate; and
a first bonding pad over the first substrate;
a die having a first surface and a second surface opposite the first surface, wherein the die is stacked on the supporter, the die comprising:
a second substrate;
an active device in the second substrate;
an interconnect structure over the second substrate;
a second bonding pad on the first surface and connected to the interconnect structure, wherein the second bonding pad is bonded to the first bonding pad of the supporter; and
a contact pad on the second surface and electrically connected to the second bonding pad; and a protection layer having a vertical portion on a sidewall of the die, and a horizontal portion extending over the supporter.

17. The semiconductor structure of claim 16, wherein the first substrate comprises a dielectric material.

18. The semiconductor structure of claim 17, wherein the first substrate comprises glass.

19. The semiconductor structure of claim 16, wherein the die and the supporter have a gap therebetween, and wherein the protection layer seals the gap.

20. The semiconductor structure of claim 16 further comprising a dielectric coating on the protection layer.

* * * * *